(12) United States Patent
Kwag et al.

(10) Patent No.: US 6,402,849 B2
(45) Date of Patent: Jun. 11, 2002

(54) PROCESS TUBE HAVING SLIT TYPE PROCESS GAS INJECTION PORTION AND HOLE TYPE WASTE GAS EXHAUST PORTION, AND APPARATUS FOR FABRICATING SEMICONDUCTOR DEVICE

(75) Inventors: Gyu-hwan Kwag; Hyun Han; Ki-heum Nam, all of Suwon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/793,314

(22) Filed: Feb. 26, 2001

(30) Foreign Application Priority Data

Mar. 17, 2000 (KR) .............................. 00-13608

(51) Int. Cl.[7] .............................. L23K 16/00
(52) U.S. Cl. .................. 118/715; 118/725; 118/730; 432/241
(58) Field of Search ................. 118/715, 724, 118/725, 730; 432/241

(56) References Cited

U.S. PATENT DOCUMENTS

| | | | | |
|---|---|---|---|---|
| 4,854,266 A | * | 8/1989 | Simson et al. | 118/728 |
| 4,950,156 A | * | 8/1990 | Philipossian | 432/253 |
| 5,015,330 A | * | 5/1991 | Okumura et al. | 156/643 |
| 5,029,554 A | * | 7/1991 | Miyashita et al. | 118/715 |
| 5,310,339 A | * | 5/1994 | Ushikawa | 432/253 |
| 5,421,892 A | * | 6/1995 | Miyagi | 118/724 |
| 5,618,349 A | * | 4/1997 | Yuuki | 118/715 |
| 5,752,609 A | * | 5/1998 | Kato et al. | 211/41.18 |
| 6,246,031 B1 | * | 6/2001 | Yoo | 219/390 |
| 6,315,859 B1 | * | 11/2001 | Donohoe | 156/345 |
| 2001/0037767 A1 | * | 11/2001 | Mitzan | 118/715 |
| 2001/0050054 A1 | * | 12/2001 | Kwag et al. | |

FOREIGN PATENT DOCUMENTS

JP          3-170676       *  1/1991

* cited by examiner

Primary Examiner—Jeffrie R. Lund
(74) Attorney, Agent, or Firm—Mills & Onello LLP

(57) ABSTRACT

A semiconductor device fabrication apparatus is provided for increasing the deposition rate of a film. The apparatus includes a process tube. Process gas injection portions in a slit configuration and waste gas exhaust portions formed as holes are integrated into the interior of the body of the process tube.

20 Claims, 6 Drawing Sheets

PROCESS TUBE HAVING SLIT TYPE PROCESS GAS INJECTION PORTION AND HOLE TYPE WASTE GAS EXHAUST PORTION, AND APPARATUS FOR FABRICATING SEMICONDUCTOR DEVICE

BACKGROUND OF THE INVENTION

1. Field of the Invention

The present invention relates to an apparatus for fabricating semiconductor devices, and more particularly, to an apparatus for performing chemical vapor deposition or oxidation/diffusion using a process tube.

2. Description of the Related Art

Low pressure chemical vapor deposition (LPCVD) equipment used for depositing films such as oxide films, nitride films, barium strontium titanate (BST) films and amorphous or polysilicon films on a semiconductor substrate, can be generally classified as a sheet-fed type or a batch type, the classification being based on the method of loading and processing wafers. Batch type LPCVD equipment loads a plurality of wafers on a boat of quartz, carries them into a process tube, and then forms a thin film at appropriate temperature and vacuum pressure while flowing a gas suitable for forming the thin film into the process tube.

LPCVD equipment includes a process tube formed of quartz, a process gas injection portion provided within the process tube, a waste gas exhaust portion for exhausting a process gas which is supplied from the process gas injection portion, a heating chamber for supplying heat to the process tube, a gas control system connected to the process gas injection portion, a vacuum pump connected to the waste gas exhaust portion, and a gas scrubber for scrubbing waste gas evacuated by the vacuum pump.

In typical LPCVD equipment that vertically loads wafers on a boat, the process gas injection portion is realized in the form of a gas nozzle within the process tube. Accordingly, a process gas flows into the process tube via a hole formed in the gas nozzle.

However, the process gas injection portion of the typical LPCVD described above has the following limitations. First, when a wafer of large diameter, for example, 300 mm, is processed, the deposition rate is too low, and thus the overall efficiency of the equipment is decreased. For example, the deposition rate of a polysilicon film is 12 Å/min, and thus it takes a long processing time of about 14 hours to form a polysilicon film 10,000 Å thick. Accordingly, a bottle neck phenomenon occurs in the overall fabrication process. To prevent this bottle neck phenomenon and to increase the overall productivity in fabricating semiconductor devices, a large amount of redundant equipment is required.

When a particular film such as an oxide film containing impurities is formed, since the large amount of film formation gas such as $SiH_4$ or $PH_3$ is used, the gas container must be frequently replaced. In addition, the used amount of gas must be frequently checked so that the film formation gas does not run out during deposition of the film. Accordingly, for management, a large amount of human labor is required. The necessity for such a large amount of LPCVD equipment and human labor during the film deposition process increases the cost of fabrication and decreases competitiveness.

Second, when wafers of large diameter, for example, 300 mm, are processed, the film is less uniform, so resulting semiconductor devices formed on the wafers tend to be less reliable.

Third, during chemical vapor deposition, a non-reactant gas is adsorbed into a hole, through which a process gas is injected, so that a particle can be created. The size of the hole of a typical gas nozzle is 0.5–0.8 mm. A non-reactant gas is adsorbed around the hole of the gas nozzle forming extraneous matter in the form of a particle, while a process gas flows through the hole. Due to the extraneous matter in particle form, the gas nozzle should be replaced periodically. The extraneous particle matter may also fall on the semiconductor substrate, thereby causing various defects.

SUMMARY OF THE INVENTION

To address the above limitations, it is a first object of the present invention to provide a process tube for fabrication of semiconductor devices which increases the deposition rate, maintains the uniformity throughout a film, and prevents the formation of particles, when the film is formed on a wafer of large diameter.

It is a second object of the present invention to provide a semiconductor device fabrication apparatus including the process tube.

Accordingly, to achieve the first object of the invention, there is provided a process tube for fabrication of semiconductor devices, which includes a plurality of slit-type process gas injection portions for supplying process gas, each of the slit-type process gas injection portions being formed on an interior surface of each of a plurality of parallel recesses, which may be configured in the vertical direction, each recess being provided in the shape of a long and narrow depression on the inner surface of a first side of a cylindrical tube body having a predetermined thickness; and a plurality of waste gas exhaust portions for evacuating waste gas after performing a process, the waste gas exhaust portions being formed on a second side of the cylindrical tube body, which faces the process gas injection portions, in the vertical direction.

Preferably, the tube body includes a buffer gas pipe realized as a space formed within the first side along the circumference, the buffer gas pipe connecting with the process gas injection portions, and a gas exhaust pipe realized as a space formed within the second side along the circumference, the gas exhaust pipe connecting with the waste gas exhaust portions.

The buffer gas pipe is connected to a gas injection pipe, which is provided in the tube body, through a plurality of passages. Preferably, the gas injection pipe is connected to a gas control system pipe, and the gas exhaust pipe is connected to a vacuum pump pipe.

At least one process gas injection portion and at least one waste gas exhaust portion are formed on the first and second sides, respectively, of the tube body within an angle of 160 degrees in the circumferential direction. It is preferable that a plurality of process gas injection portions are formed at the center, left and right of the bottom of each recess, and a plurality of waste gas exhaust portions are formed to be spaced apart by a predetermined distance in order to prevent turbulence.

Preferably, the tope of the tube body is closed.

To achieve the second object of the invention, there is provided a semiconductor device fabrication apparatus including a process tube having a plurality of slit-type process gas injection portions for supplying process gas, each of the slit-type process gas injection portions being formed on an interior surface of each of a plurality of parallel recesses, which may be formed in the vertical direction, each recess being provided in the shape of a long and narrow depression on the inner surface of a first side of a cylindrical tube body having a predetermined thickness; and a plurality of waste gas exhaust portions for evacuating waste gas after performing a process, the waste gas exhaust portions being formed on a second side of the cylindrical tube body, which faces the process gas injection portions, in a vertical direction; a heating chamber for applying heat to the process tube from the outside of the process tube; a gas control system pipe for supplying gas to the process gas injection portions of the process tube; a vacuum pump pipe connected to the waste gas exhaust portions of the process tube; and a boat which is horizontally loaded with a plurality of wafers, the boat movable in and out of the process tube.

The semiconductor device fabrication apparatus is preferably low pressure chemical vapor deposition equipment or oxidation/diffusion equipment.

It is preferable that the boat rotates at a rate of 1–70 rpm/min during the deposition of a film, and the pitch between quartz plates on which wafers are mounted is 3.5–15 mm.

Preferably, the gas control system pipe is connected to the process gas injection portions through a gas injection pipe and a buffer gas exhaust pipe, which are formed in the process tube, and the pressure in the buffer gas exhaust pipe is 1–40 torr.

According to the present invention, slit-type process gas injection portions and hole-type waste gas exhaust portions are integrated with the inside of the process tube, thereby enhancing the function of supplying process gas into the process tube and the function of evacuating waste gas from the process tube. Consequently, the present invention can improve the deposition rate when a film is deposited on a wafer of large diameter.

BRIEF DESCRIPTION OF THE DRAWINGS

The above features and advantages of the present invention will become more apparent by describing in detail preferred embodiments thereof with reference to the attached drawings in which.

DETAILED DESCRIPTION OF PREFERRED EMBODIMENTS

Figure 1:
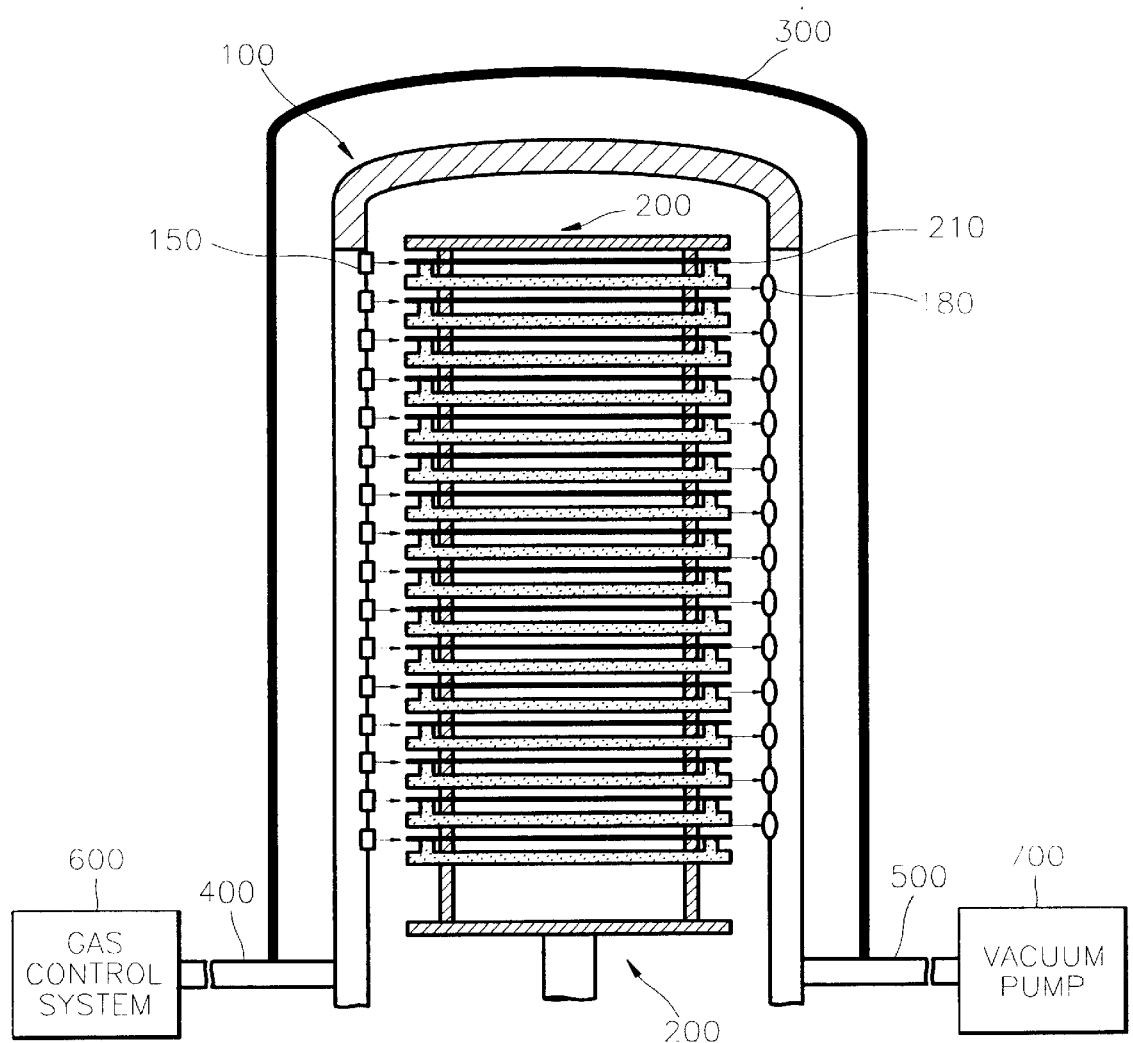
FIG. 1 is a schematic sectional view of a semiconductor device fabrication apparatus according to the present invention.

Hereinafter, an embodiment of the present invention will be described in detail with reference to the attached drawings. In the drawings, the same reference numerals denote the same elements.

Referring to FIG. 1, a semiconductor device fabrication apparatus of the present invention includes a process tube 100, a boat 200, a heating chamber 300, a gas control system pipe 400 and a vacuum pump pipe 500. The process tube 100 is formed of quartz and has a cylindrical shape of a predetermined thickness with a closed upper portion. The process tube 100 also includes a slit type process gas injection portion 150 and a hole type waste gas exhaust portion 180. The process gas injection portion 150 and the waste gas exhaust portion 180 are integrated with the body of the process tube 100.

Low pressure chemical vapor deposition equipment must be disassembled after it is used for a predetermined period in order to remove a film adhering to the process tube 100. The film adhering to the process tube 100 is commonly removed by wet cleaning or in-situ cleaning using a $CLF_3$ gas.

In existing separable equipment, accumulated films adhere to an internal process tube, an external process tube and a gas nozzle. Accordingly, a large amount of time and labor and a large area are required for cleaning the accumulated films. In addition, even if a slight misarrangement occurs when these members are reassembled, the performance of the equipment can be changed drastically, such that reassembly of the equipment is time consuming. Moreover, when the equipment is disassembled and reassembled, the quartz process tube can be exposed to shock, and thus it may happen that the process tube is broken, scratched or cracked.

On the other hand, when the process gas injection portion 150 and the waste gas exhaust portion are integrated with the single process tube 100 according to the present invention, the problems stated above can be prevented in maintaining and repairing the equipment. Accordingly, the reliability and repeatability of the present invention are superior to those of the existing separable equipment. The characteristics of the internal structure of the process tube 100 will be described more fully with reference to the other accompanying drawings.

The boat 200, which is loaded with a plurality of wafers 210, moves up and down within the cylinder of the process tube 100, and is formed of quartz. The heating chamber 300 is formed outside the process tube 100 to apply heat to the process tube 100, and has a cylindrical shape in the present invention. The gas control system pipe 400 is a passage for supplying a gas from a gas control system 600 to the process gas injection portion 150 of the process tube. The gas control system 600 mixes and purges gas for forming a film and controls the flow rate of the gas.

The vacuum pump pipe 500 is connected to the waste gas exhaust portion 180 of the process tube 100 and serves as a passage for evacuating waste gas from the process tube 100 after formation of a film. The operation of the vacuum pump pipe 500 is subjected to the operation of a vacuum pump 700. The waste gas evacuated from the process tube 100 through the vacuum pump 700 undergoes combustion and adsorption to be displaced by a gas, which is safe and suitable for protection of the environment, in a gas scrubber (not shown), and then is finally evacuated from the building.

Figure 2:
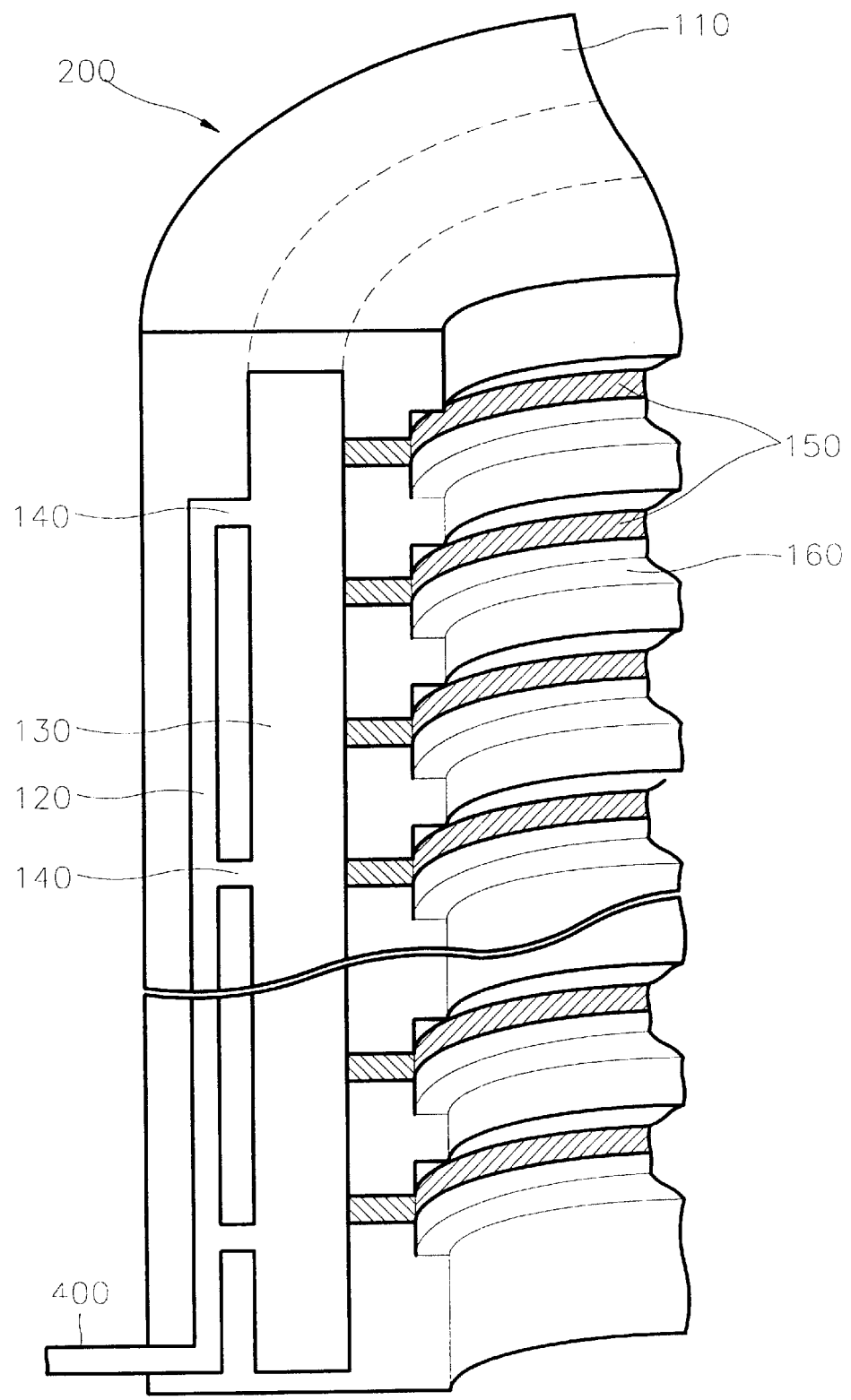
FIG. 2 is a schematic perspective view for explaining a process gas injection portion of a process tube in a semiconductor device fabrication apparatus according to the present invention.

FIG. 2 is a perspective view of the first side of the process tube 100 for explaining injection of a process gas into the process tube 100. A process gas flows into the body 110 of the process tube 100 through the gas control system pipe 400. In the process tube 100, the process gas flows into a gas injection pipe 120 and then flows from the gas injection pipe 120 into a buffer gas pipe 130 through a plurality of connecting passages 140. Thereafter, the process gas is ejected to a wafer on the boat 200 of FIG. 1 through the process gas injection portion 150, which is formed to be a slit, rather than a hole.

A recess 160 is formed on the inner surface of the first side of the tube body 110, on which the slit type process gas injection portion 150 is formed. The recess 160 is formed by cutting a quadrilateral groove on the inner surface of the first side of the tube body 110, so that it functions as a passage through which a process gas is straightforwardly ejected to wafers on the boat. The recess 160 may have a different shape than the quadrilateral groove described above. In other words, any shape can be adopted if it improves the straightness in flow of the process gas.

In existing low pressure chemical vapor deposition (LPCVD) equipment, a process gas is injected through the hole of a nozzle which is constructed separately from the process tube. On the other hand, in the present invention, a process gas is ejected to a wafer loaded on a boat in a predetermined direction through the slit type gas injection portion 150 at the recess 160. Accordingly, more process gas can be injected to the wafer on the boat, as compared to existing methods, thereby increasing film deposition rate. At this time, it is preferable that the pressure of the process gas injection portion 150 is 1–40 torr, which is quite high compared to the existing pressure of about 1.5 torr.

In a conventional experimental embodiment, when an existing nozzle type process gas injection portion was used, the deposition rate of a polysilicon film was very low at 13 Å/min. On the other hand, when a polysilicon film was deposited using the structure of the present invention, the deposition rate was 120–150 Å/min, which is quite an improvement compared to the existing structure.

Figure 3:
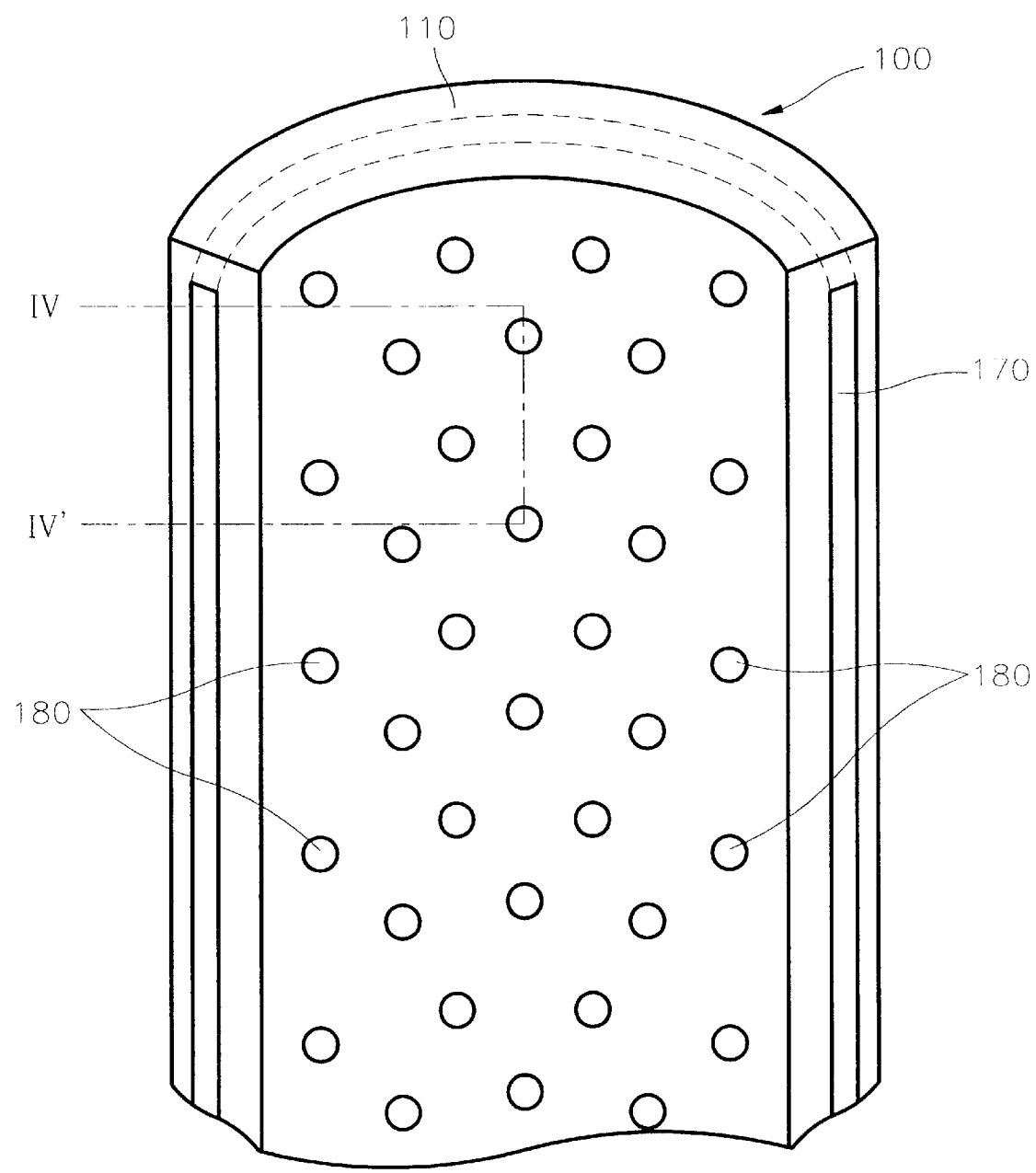
FIG. 3 is a schematic perspective view for explaining a waste gas exhaust portion of a process tube in a semiconductor device fabrication apparatus according to the present invention.

FIG. 3 is a schematic perspective view illustrating a waste gas exhaust portion of a process tube in a semiconductor device fabrication apparatus according to the present invention. Referring to FIG. 3, a gas exhaust pipe 170 is realized as a space formed within the tube body 110 along the wall of a second side of the tube body 110. The gas exhaust pipe 170 communicates with the hole type waste gas exhaust portion 180. A plurality of holes 180 of the waste gas exhaust portion are spaced apart by a predetermined distance on the inner surface of the second side of the tube body 110.

According to the present invention, the process gas injection portion has a slit shape, and therefore gas is directly injected to a wafer through each process gas injection portion. It is crucial for a process tube according to the present invention to maintain a uniform vacuum between the process gas injection portion and the waste gas exhaust portion 180. The structure, in which the waste gas exhaust portions 180 are distributed uniformly on the inner surface of the process tube, spaced apart by a predetermined distance, is suitable for exhausting a non-reactant gas while controlling turbulence of vacuum in the process tube 100. The multiple holes of the waste gas exhaust portions 180 arranged in a horizontal row may correspond to the process gas injection portions 150 of FIG. 2 in a one to one or two to one relationship. The shape of the waste gas exhaust portion 180 can alternatively be designed to be an ellipse, a circle or some other shape.

Consequently, in addition to the structure of the slit type process gas injection portions, the structure in which multi-hole type waste gas exhaust portions 180 are spaced apart by a predetermined distance and formed to restrain turbulence of vacuum is a major means for improving the deposition rate of a film, which is the purpose of the present invention.

Figure 4:
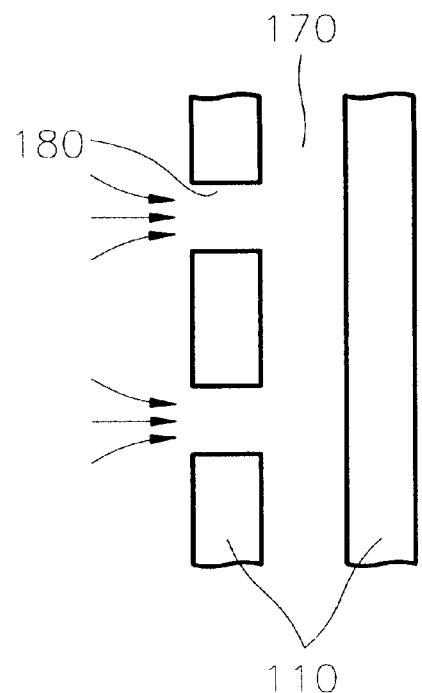
FIG. 4 is a sectional view for explaining the connection between the waste gas exhaust portion and the gas exhaust pipe of a process tube in a semiconductor device fabrication apparatus according to the present invention.

FIG. 4 is a sectional view for explaining the connection between the waste gas exhaust portion and the gas exhaust pipe of a process tube in a semiconductor device fabrication apparatus according to the present invention. More specifically, FIG. 4 is a sectional view taken along the line IV–IV' of FIG. 3, and shows that the gas exhaust pipe 170 in the form of a space is directly connected to the waste gas exhaust portion 180 within the tube body 110.

Figure 5:
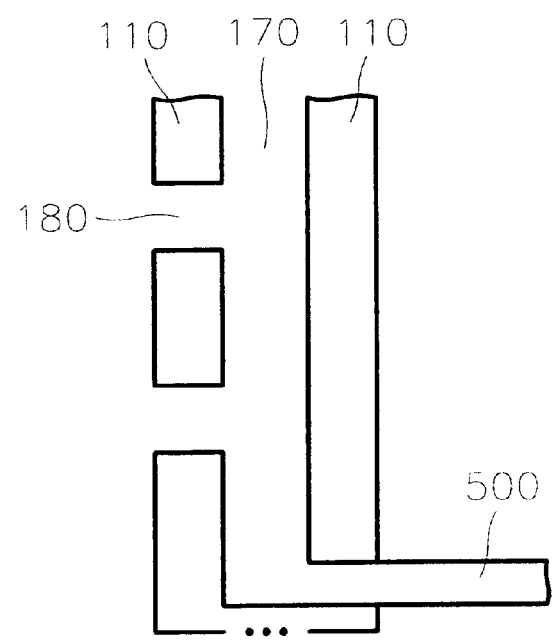
FIG. 5 is a sectional view for explaining the connection between the gas exhaust pipe of a process tube and a vacuum pump pipe in a semiconductor device fabrication apparatus according to the present invention.

FIG. 5 is a sectional view for illustrating the connection between the gas exhaust pipe of a process tube and a vacuum pump pipe in a semiconductor device fabrication apparatus according to the present invention. More specifically, the gas exhaust pipe 170, which is connected to the waste gas exhaust portion 180, is also connected to the vacuum pump pipe 500, so that waste gas can be evacuated from the process tube with the aid of the vacuum pump.

Figure 6:
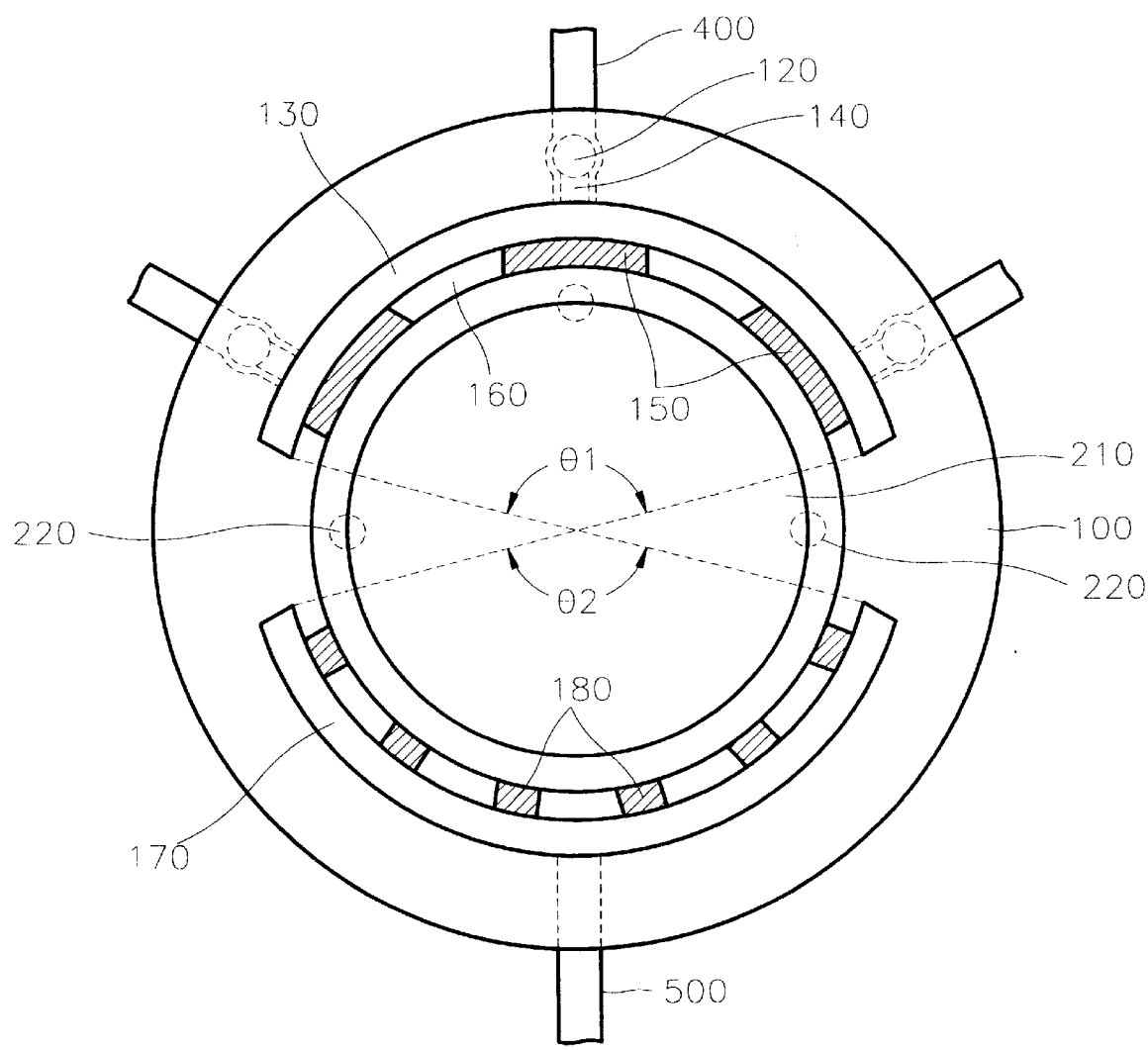
FIG. 6 is a plan view for explaining a case in which a boat loaded with wafers is put into a process tube of a semiconductor device fabrication apparatus according to the present invention.

FIG. 6 is a plan view for illustrating a case in which a boat loaded with wafers is put into a process tube of a semiconductor device fabrication apparatus according to the present invention. More specifically, FIG. 6 clearly shows the overall appearance of 10 the process tube which is partially described with reference to FIGS. 2 through 5. The buffer gas pipe 130 is realized as a space, which is formed within the tube body 110 of the process tube 100 along the circumference of the first side of the tube body 110. The buffer gas pipe 130 is connected to the slit-type process gas injection portions 150 and to the gas injection pipe 120. The gas injection pipe 120 is connected to the gas control system pipe 400. In an embodiment of the present invention, three gas control system pipes 400 are provided, but the embodiment of the present invention can be modified to be suitable for a case in which one, two, or more than three gas control system pipes are provided.

The gas exhaust pipe 170, which is formed within the second side of the tube body 110 of the process tube 100, is connected to the waste gas exhaust portions 180, which are formed on the inner surface of the tube body 110, and to the vacuum pump pipe 500. The process gas injection portions 150 are formed within an angle $\theta 1$, and the waste gas exhaust portions 180 are formed within an angle $\theta 2$. Each of the angles $\theta 1$ and $\theta 2$ is preferably within 160 degrees, which can minimize the hunting area on a wafer 210. A hunting area is a portion of the wafer 210 on which a film is not deposited due to the air flow between the process gas injection portions 150 and the waste gas exhaust portions 180, assuming that the boat does not rotate.

Reference numeral 220 denotes a rod of the boat loaded with the wafer 210. The first side of the process tube 100 indicates a portion within the angle $\theta 1$, and the second side indicates a portion within the angle $\theta 2$.

Figure 7:
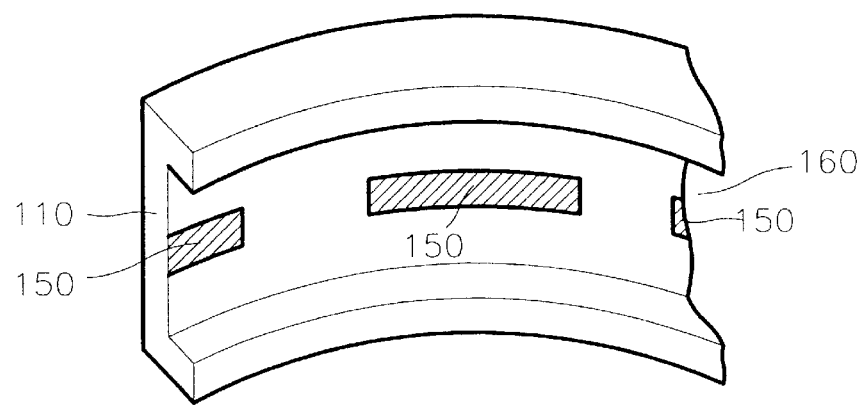
FIG. 7 is a perspective view for explaining the structure of the recess and process gas injection portion of a process tube in a semiconductor device fabrication apparatus according to the present invention.

FIG. 7 is a perspective view for illustrating the structure of the recess and process gas injection portion of a process tube in a semiconductor device fabrication apparatus according to the present invention. More specifically, FIG. 7 shows the structure of the slit-type process gas injection portions 150, which are formed in recesses 160 at the first side of the tube body 110. The process gas injection portions 150 are formed at three positions, i.e., in the center, left and right portions of a recess 160, within the angle θ1 (see FIG. 6).

The shape of the slit may vary, for example, the slit may be elliptical, diamond or rectangular. In the present invention, a slit is defined as a closed curve whose horizontal length is longer than the vertical length. In the illustrated embodiment of the present invention, three slits are formed, but the number of slits is not restricted to three.

Compared to the conventional method of injecting gas through the hole of a nozzle, the present invention can inject more process gas into the process tube using the slit-type process gas injection portion 150 and the recess 160, so that most of the process gas straightforwardly flows over a wafer being processed within the process tube. Therefore, the deposition rate of a film, which is formed on a wafer loaded on a boat, can be considerably improved.

In the conventional method of injecting a gas through the hole of a nozzle, the injection of a particular gas such as $PH_3$ for forming the film is not smoothly performed, and thus the amount of $SiH_4$ gas, which is supplied together with $PH_3$ gas, is restricted, thereby decreasing the deposition rate. On the other hand, the slit-type process gas injection portion 150 of the present invention allows smooth injection of $PH_3$ gas. Therefore, in the case of polysilicon, the deposition rate can be greatly increased from 12 Å/min to 100 Å/min.

Figure 8:
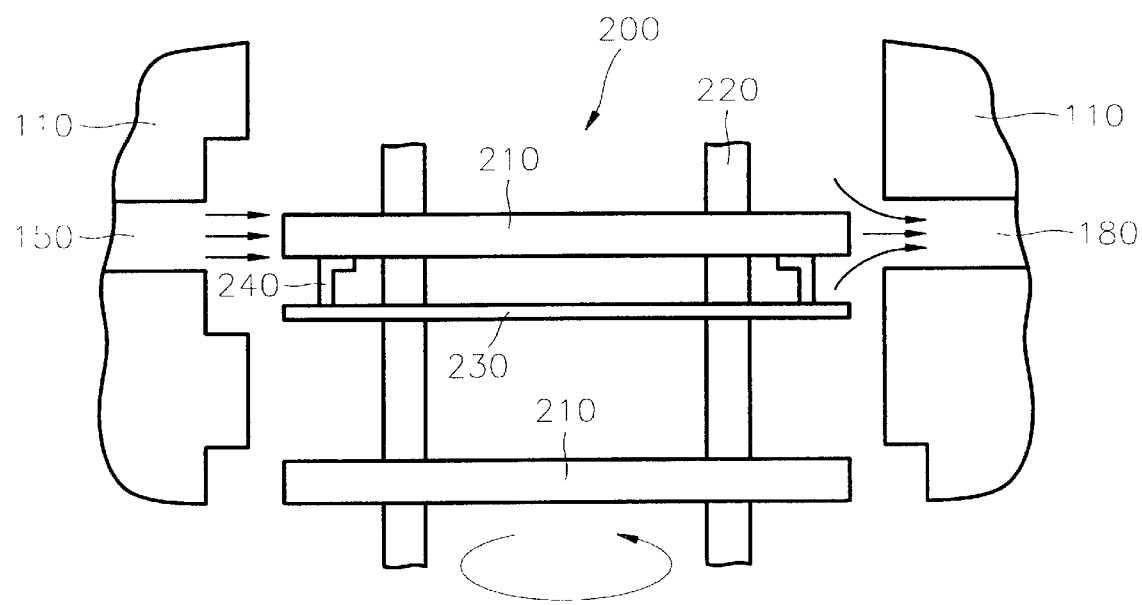
FIG. 8 is a sectional view for explaining a procedure of processing a wafer within a process tube of a semiconductor device fabrication apparatus according to the present invention.

FIG. 8 is a sectional view for explaining a procedure of processing a wafer within a process tube of a semiconductor device fabrication apparatus according to the present invention. More specifically, the wafer 210 is loaded on the boat 200 in a batch mode and put within the tube body 110. Conventionally, 100 or more wafers are loaded on a boat, but it is preferable that 50–80 wafers are loaded on the boat in the present invention. Accordingly, the pitch between quartz plates 230 of the boat 200 is preferably 3.5–15 mm, which is slightly wider than the conventional pitch of 3.5–12 mm. Reference numeral 240 denotes a wafer mount.

Using conventional technology, during formation of a film, the rate of rotation of the boat 200 is relatively slow at 1–9 RPM. However, it is preferable to increase the rate of rotation of the boat 200 to 1–70 RPM in the present invention in which the large amount of process gas is ejected to the top of a wafer through the slit-type process gas injection portion 150, and in which waste gas is exhausted through the multiple hole-type waste gas exhaust portions 180. Therefore, the present invention maintains the uniformity of a film, which is formed on a wafer, equally to conventional equipment and methods.

In an embodiment of the present invention, the ring-type boat 200 is proposed as an example. However, the type of boat may be modified to, for example, a slot type, within the scope including the technological characteristics of the present invention.

It is preferable that the temperature within the process tube is 450–750° C. when the film to be formed on a wafer is a nitride film, the temperature is 800–900° C. when the film is a high temperature oxide film, and the temperature is 1000–1200° C. when the film is a silicide film.

According to the present invention, first, the deposition rate of a film in semiconductor equipment using a tube, for example, LPCVD equipment, is improved, thereby increasing the efficiency and productivity of the equipment. This effect can be more highly achieved when a wafer has a large diameter. Second, the present invention can prevent a decrease in the uniformity of a film when the film is formed on a wafer of large diameter. Third, according to the present invention, the passage through which process gas is injected becomes larger from a small hole to a slit-type, thereby restricting the formation of particles caused by adsorption of process gas into the injection portion.

While this invention has been particularly shown and described with references to preferred embodiments thereof, it will be understood by those skilled in the art that various changes in form and details may be made therein without departing from the spirit and scope of the invention as defined by the following claims.

What is claimed is:

1. A process tube for fabrication of semiconductor devices, comprising:

a plurality of process gas injection slits for supplying process gas, each of the process gas injection slits being formed on an interior surface of each of a plurality of parallel recesses, each recess being in the shape of an elongated narrow depression on an inner surface of a first side of a cylindrical tube body; and a plurality of waste gas exhaust apertures for evacuating waste gas, the waste gas exhaust apertures being formed on a second side of the cylindrical tube body inner surface opposite the first side.

2. The process tube of claim 1, wherein the tube body comprises:

a buffer gas pipe provided as a space formed within the first side along a circumference of the cylindrical tube body, the buffer gas pipe communicating with the process gas injection slits; and a gas exhaust pipe provided as a space formed within the second side along the circumference, the gas exhaust pipe communicating with the waste gas exhaust apertures.

3. The process tube of claim 2, wherein the buffer gas pipe is connected to a gas injection pipe, which is provided in the tube body, through a plurality of passages.

4. The process tube of claim 3, wherein the gas injection pipe is connected to a gas control system pipe.

5. The process tube of claim 2, wherein the gas exhaust pipe is connected to a vacuum pump pipe.

6. The process tube of claim 1, wherein a top of the cylindrical tube body is closed.

7. The process tube of claim 1, wherein at least one process gas injection slit is formed on the first side of the tube body within an angle of 160 degrees in the circumferential direction.

8. The process tube of claim 7, wherein each process gas injection slit includes multiple slits formed at a center, left and right portion of the inner surface of each recess.

9. The process tube of claim 1, wherein at least one waste gas exhaust aperture is formed on the second side of the tube body within an angle of 160 degrees in the circumferential direction.

10. The precess tube of claim 9, wherein the waste gas exhaust apertures are provided on the second side spaced apart by predetermined distances in order to prevent turbulence.

11. A semiconductor device fabrication apparatus comprising:

a process tube comprising a plurality of process gas injection slits for supplying process gas, each of the process gas injection slits being formed on an interior surface of each of a plurality of parallel recesses, each recess being in the shape of an elongated narrow depression on an inner surface of a first side of a cylindrical tube body; and a plurality of waste gas exhaust apertures for evacuating waste gas, the waste gas exhaust apertures being formed on a second side of the cylindrical tube body inner surface opposite the first side;

a heating chamber for applying external heat to the process tube;

a gas control system pipe for supplying gas to the process gas injection slits of the process tube;

a vacuum pump pipe connected to the waste gas exhaust apertures of the process tube; and a boat movable in and out of the process tube.

12. The apparatus of claim 11, wherein the boat is for low pressure chemical vapor deposition equipment or oxidation/diffusion equipment.

13. The apparatus of claim 11, wherein the boat rotates at a rate of 1–70 rpm/min during the deposition of a film.

14. The apparatus of claim 11, wherein the boat comprises quartz plates on which wafers are mounted, and the pitch between quartz plates is in the range of 3.5–15 mm.

15. The apparatus of claim 11, wherein the gas control system pipe is connected to the process gas injection slits through a gas injection pipe and a buffer gas exhaust pipe, which are formed in the process tube, and wherein the pressure in the buffer gas exhaust pipe is 1–40 torr.

16. The apparatus of claim 11, wherein the process gas injection slits are formed in an inner surface of each recess in the first side of the process tube within an angle of 160 degrees in the circumferential direction.

17. The apparatus of claim 11, wherein the waste gas injection apertures are formed on the inner surface of the second side of the process tube within an angle of 160 degrees in the circumferential direction.

18. The apparatus of claim 11, wherein at least one process gas injection slit is formed on the bottom of each recess of the process tube.

19. The apparatus of claim 11, wherein each process gas injection slit includes multiple slits formed at a center, left and right portion of the inner surface of each recess.

20. The apparatus of claim 11, wherein the waste gas exhaust apertures are provided on the second side spaced apart by predetermined distances in order to prevent turbulence.

* * * * *